US007447053B2

(12) United States Patent
Liaw et al.

(10) Patent No.: US 7,447,053 B2
(45) Date of Patent: Nov. 4, 2008

(54) MEMORY DEVICE AND METHOD FOR OPERATING SUCH A MEMORY DEVICE

(75) Inventors: Corvin Liaw, Munich (DE); Heinz Hoenigschmid, Pöcking (DE)

(73) Assignee: Infineon Technologies AG, Neubiberg (DE)

( * ) Notice: Subject to any disclaimer, the term of this patent is extended or adjusted under 35 U.S.C. 154(b) by 94 days.

(21) Appl. No.: 11/369,275

(22) Filed: Mar. 7, 2006

(65) Prior Publication Data
US 2007/0211513 A1 Sep. 13, 2007

(51) Int. Cl.
*G11C 17/00* (2006.01)
(52) U.S. Cl. .................. 365/100; 365/104; 365/148
(58) Field of Classification Search ................ 365/163, 365/148, 100, 104
See application file for complete search history.

(56) References Cited

U.S. PATENT DOCUMENTS

| 4,583,201 | A  | * | 4/1986  | Bertin et al. ............ 365/104 |
| 7,042,760 | B2 | * | 5/2006  | Hwang et al. ............ 365/163 |
| 7,149,100 | B2 | * | 12/2006 | Nazarian .................. 365/46 |
| 7,298,640 | B2 | * | 11/2007 | Chen et al. ............... 365/148 |
| 2005/0185444 | A1 |  | 8/2005 | Yang et al. |
| 2007/0002608 | A1 | * | 1/2007 | Hsu et al. ................ 365/163 |

* cited by examiner

*Primary Examiner*—Pho M. Luu
(74) *Attorney, Agent, or Firm*—Dicke, Billig & Czaja, PLLC

(57) ABSTRACT

A memory device and method for operating a memory device is described. In one embodiment, the memory device has at least one memory cell including an active material, a current supply line, and a first switching device for switching a first current from the current supply line through the active material. The memory cell additionally includes at least one further switching device for switching a further current from the current supply line through the active material.

28 Claims, 3 Drawing Sheets

MEMORY DEVICE AND METHOD FOR OPERATING SUCH A MEMORY DEVICE

FIELD OF THE INVENTION

The invention relates to a memory device with a plurality of memory cells, in particular PCM memory cells, and to a method for operating such a memory device.

BACKGROUND

In the case of conventional memory devices, in particular conventional semiconductor memory devices, one differentiates between so-called functional memory devices (e.g. PLAs, PALs, etc.), and so-called table memory devices, e.g. ROM devices (ROM=Read Only Memory—in particular PROMs, EPROMs, EEPROMs, flash memories, etc.), and RAM devices (RAM=Random Access Memory or read-write memory, e.g. DRAMs and SRAMs).

A RAM device is a memory for storing data under a predetermined address and for reading out the data under this address later.

In the case of SRAMs (SRAM=Static Random Access Memory), the individual memory cells consist e.g. of few, for instance 6, transistors, and in the case of so-called DRAMs (DRAM=Dynamic Random Access Memory) in general only of one single, correspondingly controlled capacitive element (e.g. the gate-source capacitor of a MOSFET) with the capacitance of which one bit each can be stored as charge.

This charge, however, remains for a short time only. Therefore, a so-called "refresh" must be performed regularly, e.g. approximately every 64 ms.

In contrast to that, no "refresh" has to be performed in the case of SRAMs, i.e. the data stored in the memory cell remain stored as long as an appropriate supply voltage is fed to the SRAM.

In the case of non-volatile memory devices (NVMs), e.g. EPROMs, EEPROMs, and flash memories, the stored data remain, however, stored even when the supply voltage is switched off.

Furthermore, so-called "resistive" or "resistively switching" memory devices have also become known recently, e.g. so-called Phase Change Memories ("PCMs").

In the case of "resistive" or "resistively switching" memory devices, an "active" or "switching active" material—which is, for instance, positioned between two appropriate electrodes (i.e. an anode and a cathode)—is placed, by appropriate switching processes, in a more or less conductive state (wherein e.g. the more conductive state corresponds to a stored, logic "one", and the less conductive state to a stored, logic "zero", or vice versa). This may, for instance, correspond to the logic arrangement of a bit.

In the case of phase change memories (PCRAMs), for instance, an appropriate chalcogenide compound may be used as a "switching active" a material that is positioned between two corresponding electrodes (e.g. a Ge—Sb—Te ("GST") or an Ag—In—Sb—Te compound).

The chalcogenide compound material is adapted to be placed in an amorphous i.e. a relatively weakly conductive, or a crystalline, i.e. a relatively strongly conductive state by appropriate switching processes (wherein e.g. the relatively strongly conductive state may correspond to a stored, logic "one", and the relatively weakly conductive state may correspond to a stored, logic "zero", or vice versa).

Phase change memory cells are, for instance, known from G. Wicker, "Nonvolatile, High Density, High Performance Phase Change Memory", SPIE Conference on Electronics and Structures for MEMS, Vol. 3891, Queensland, 2, 1999, and e.g. from Y. N. Hwang et al., "Completely CMOS Compatible Phase Change Nonvolatile RAM Using NMOS Cell Transistors", IEEE Proceedings of the Nonvolatile Semiconductor Memory Workshop, Monterey, 91, 2003, and from S. Lai et al., "OUM-a 180 nm nonvolatile memory cell element technology for stand alone and embedded applications", IEDM 2001, etc.

In order to achieve, with a corresponding memory cell, a change from an amorphous, i.e. a relatively weakly conductive state of the switching active material, to a crystalline, i.e. a relatively strongly conductive state, an appropriate heating current pulse can be applied at the electrodes, said heating current pulse resulting in that the switching active material is heated beyond the crystallization temperature and crystallizes ("writing process").

Vice versa, a change of state of the switching active material from a crystalline, i.e. a relatively strongly conductive state, to an amorphous, i.e. a relatively weakly conductive state, may, for instance, be achieved in that—again by means of an appropriate heating current pulse—the switching active material is heated beyond the melting temperature and is subsequently "quenched" to an amorphous state by quick cooling ("deleting process").

Typically, the temperature for the deleting process has to reach a higher level than that for the writing process but can be of a shorter duration.

Phase change memory cells based on this or a corresponding principle are, for instance, described in the publication Y. Ha et al.: "An edge contact type cell for phase change RAM featuring very low power consumption", VLSI 2003, and e.g. in H. Horii et al.: "A novel cell technology using N-doped GeSbTe films for phase change RAM", VLSI 2003, Y. Hwang et al.: "Full integration and reliability evaluation of phase-change RAM based on 0.24 μm-CMOS technologies", VLSI 2003, and S. Ahn et al.: "Highly Manufacturable High Density Phase Change Memory of 64 Mb and beyond", IEDM 2004, etc.

The transistors driving the delete or write heating current pulses—e.g. via appropriate bit and ground lines—therefore have to be dimensioned appropriately.

A problem is the fact that due to relatively high currents to switch the Phase Change memory cells (that are, e.g., implemented in an $8F^2$ arrangement) the transistors had to have a dimension, i.e., typically a width, that is larger than a minimal structural width. This makes these memory cells and thus a respective memory device less compact and therefore allows for less memory compared to a cell or device using a minimal structural width of the transistors.

To generate larger currents through a Phase Change memory cell, it has been suggested to reduce the electric resistance of the corresponding lines as much as possible (cf. e.g. W. Cho et al.: "A 0.18 um 3.0-V 64-Mb nonvolatile phase transition random access memory (PRAM)", IEEE J. Sol. State Circuits 40, 293, 2005).

It has further been suggested to make the delete or write voltages used for the respectively driving transistor dependent on the position of the respectively controlled memory cell within the memory cell field (cf. e.g. F. Bedeschi et al.: "A 8 Mb demonstrator for high density 1.8V Phase-change memories", VLSI 2004).

The incurred relatively high switching complexity is of disadvantage.

For these and other reasons, there is a need for the present invention.

SUMMARY

The present invention provides a memory device and method for operating a memory device. In one embodiment, the memory device has at least one memory cell including an active material, a current supply line, and a first switching device for switching a first current from the current supply line through the active material. The memory cell additionally comprises at least one further switching device for switching a further current from the current supply line through the active material.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
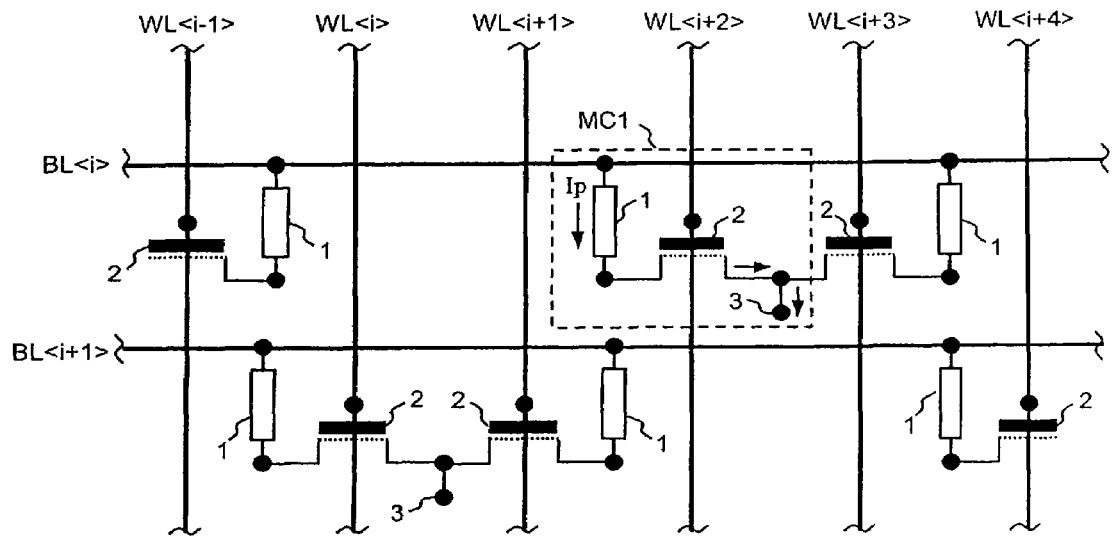
FIG. 1 illustrates a schematic circuit diagram of an exemplary structure of a resistively switching memory cell according to prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a novel memory device with a plurality of memory cells, in particular PCM memory cells, that allows a higher current through the active material in relation to the width of an associated switching device; and a novel method for operating such a memory device.

In accordance with one embodiment of the invention there is provided a memory device with at least one memory cell that at least comprises: an active material; a first switching device assigned thereto for switching a current through the active material; a current supply line; and a current discharge terminal. This at least one memory cell is additionally assigned at least one further switching device for controlling a further current through the active material.

According to another embodiment of the invention there is provided a method for operating a memory device with at least one memory cell comprising an active material, a current supply line, a current discharge terminal, and a first switching device for switching a first current from the current supply line through said active material to said current discharge terminal, wherein the method includes:

supplying a first current to a respectively selected memory cell via said current supply line; and discharging the first current, wherein the memory cell additionally includes: at least one further switching device for switching a further current from the current supply line through said active material, wherein the method further includes:

supplying a further current to said selected memory cell via the associated current supply line; and discharging the further current.

The switching device can be any device appropriate to switch a current through the active material, esp. a transistor. The switching device can have two (e.g., ON/OFF) or more (e.g., ON/OFF and intermediate) switching states. The switching devices can, for example, be logically positioned in front of or behind the active material as seen from the direction of the flow of the current, as it is appropriate for the layout of the memory cell and memory device, respectively.

The active material can be any material that is switched by guiding/driving a current through it. Advantageously, the active material is a resistively switching material. Accordingly, the memory cells are advantageously resistively switching memory cells, especially PCM active materials and PCM memory cells, respectively.

The currents switched through the active material can be discharged by any suitable means, e.g. by discharge terminals that may all be electrically connected to a common discharge, e.g. ground, line or ground plane.

It is advantageous if the additional switching device(s) is/are arranged on the memory cell such that the memory device can have the same number of memory cells, i.e. that the additional switching device(s) does/do not use(s) additional design space.

Advantageously, the current supply line and the current discharge line are connected at opposing ends of the respective memory cell.

Thus, it can be achieved that a combined current (i.e., the first current and the further current) is guided through the active material such that the dimensions, e.g., the width, of a single switching device, especially a transistor, can be reduced accordingly.

This is especially advantageous for memory cells of a 'folded bit line' architecture layout, particularly of a $8F^2$ shape, because it is then possible to introduce the additional transistors without distorting or altering the cell shape or position of existing functional elements.

FIG. 1 illustrates—purely schematically and for the sake of example—the structure of a resistively switching memory cell MC1 (here: of a phase change memory cell MC1) according to prior art. The memory cell MC1 is one of several other memory cells of a memory device that for the sake of clarity are not specially indicated. For the sake of simplicity, the same reference numbers are used for functionally similar components/elements.

The memory cell MC1 comprises an 'active' or 'switching active' material 1, e.g. a phase change material containing an appropriate chalcogenide compound (e.g. a Ge—Sb—Te or an Ag—In—Sb—Te compound). On one side, the active material 1 is coupled to a current supply line BL<i> wherein i denotes an i-th (i being an integer) current supply line and wherein this current supply line BL<i> is associated to be the bit line for the PCM memory cell MC1. On the other side, the active material 1 is coupled to a current discharge terminal 3 that in turn is coupled to a ground line (not depicted). Between the active material 1 and the discharge terminal 3 is positioned a first switching device 2 for switching a first current through the active material 1. The first switching device 2 is coupled to a first control line, i.e. a word line WL<i+2> in this embodiment. The first switching device 2 can be of a transistor type, e. g. of a Bipolar Junction Transistor type with the word line WL<i+2> applying a current to its base or of a FET type with the word line WL<i+2> applying a voltage to its gate.

By applying/disconnecting a predefined voltage or current to the word line WL<i+2>, the first switching device 2 can thus be selectively opened and closed to respectively open and close an electrical connection between the bit line BL<i> through the first switching device 2 and then the discharge terminal 3. If opened, a current Ip, as depicted by the arrows, can flow from the bit line BL<i> through the active material 1 further through the first switching device 2 to the discharge terminal 3. Accordingly, a voltage of the discharge terminal 3 is lower than a voltage of the bit line BL<i>, e. g. 0V/connected to ground. All discharge terminals 3 can be electrically connected by a discharge network, e.g. a ground plane.

The current Ip is typically dependent from the intended usage of the memory cell MC1:
a) if operative, the associated word line WL<i+2> is opened (e.g., a positive voltage is applied to it) and
to set the selected memory cell MC1 (e.g. to logical '1'), a voltage Vset of a predefined duration and shape ('crystallizing pulse') is applied to the associated bit line BL<i> to bring the active material 1 into a crystalline phase with a low resistance/high conductivity ('writing process');
to reset the selected memory cell MC1 (e.g. to logical '0'), a voltage Vreset of a different predefined duration and shape ('amorphizing pulse') is applied to the associated bit line BL<i> to bring the active material 1 into an amorphous phase with a higher resistance/lower conductivity ('deleting process');
to read the selected memory cell MC1, a voltage Vread of a further different predefined duration and shape ('read pulse') is applied that does not alter the phase of the active material but is sufficient to determine the actual phase and thus its logical state, e.g. by measuring the current Ip for the reading process; and
b) if non-operative, the associated word line WL<i+2> is closed, e.g., on 0 V or a negative voltage level.

The predefined duration and shape of these pulses can be controlled either by the voltage or current applied to the bit line BL<i> or by the voltage or current applied to the word line WL<i+2> which would than act as an 'electrical valve'.

Phase change memory cells are, for instance, known from G. Wicker, Nonvolatile, High Density, High Performance Phase Change Memory, SPIE Conference on Electronics and Structures for MEMS, Vol. 3891, Queensland, 2, 1999, and e.g. from Y. N. Hwang et al., Completely CMOS Compatible Phase Change Nonvolatile RAM Using NMOS Cell Transistors, IEEE Proceedings of the Nonvolatile Semiconductor Memory Workshop, Monterey, 91, 2003, and from S. Lai et al., OUM-a 180 nm nonvolatile memory cell element technology for stand alone and embedded applications, IEDM 2001, etc.

As depicted, other memory cells are present in this cut-out/partial diagram from a larger memory device, e.g. just to the right of MC1 using the same discharge terminal 3 or one bit line below, i. e. using bit line BL<i+1> and word lines WL<i> and WL <i+1>, resp. This pattern can be extended by repeating the cut-out shown to the left or right of every four word lines and to above and below of every two bit lines, and adapting the respective numbering of the bit lines and word lines. For example, bit lines BL<i+2> and BL<i+3> and their associated components are then similar to the bit lines BL<i> and BL<i+1>, resp., and the word lines WL<i+4> to WL<i+7> and their associated components are then similar to the word lines WL<i> to WL<i+3>, respectively.

In this arrangement, according to the prior art, the transistors 2 must be large enough to let a sufficient current Ip flow through the active material 1 to generate a phase change, esp. to generate an amorphizing pulse.

Figure 2:
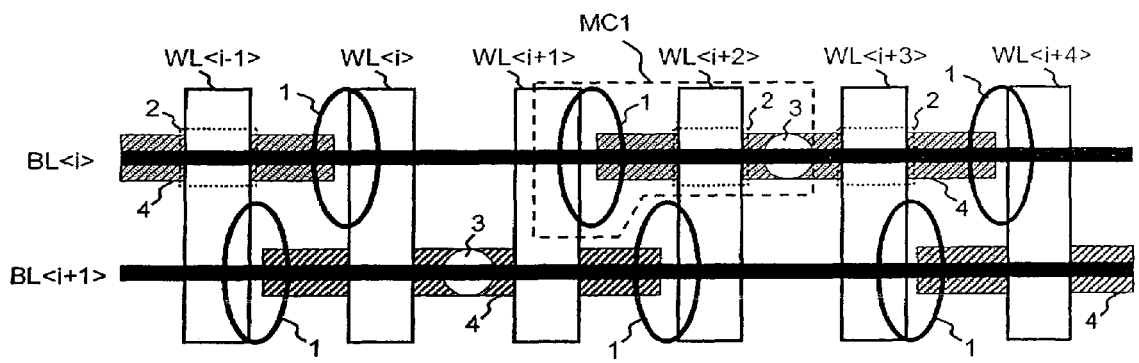
FIG. 2 illustrates a schematic view of the positions of various components of memory cells of a folded bit line architecture layout with respect to a common plane according to prior art corresponding to the circuitry depicted in FIG. 1.

FIG. 2 illustrates a top view on a plane of a layout according to the prior art that corresponds to the circuit diagram of FIG. 1 with the positions of various components schematically drawn. An associated three-dimensional memory cell could be $8F^2$ shaped. For the sake of simplicity, the same reference numbers as in FIG. 1 are used for functionally similar components/elements.

Referring now to FIG. 2, horizontal bit lines BL<i> and BL<i+1> are connected to one side of areas of active material 1. The active material 1 is on another side connected to a transistor 2 that is formed at each crossing between a word line WL and a diffusion area 4. Two neighboring transistors 2 are on one side connected to a common discharge terminal 3 and on the opposite side to the active material 1 via a contact on the source/drain area (not shown). The position of the resulting memory cell MC1 is depicted by a dashed line.

The phase change memory cells MC1 may—optionally—be provided with an appropriate heating material layer (not shown)—which has, for instance, a relatively high resistance—next to the active material 1, wherein the heating material might be surrounded by an appropriate insulation layer.

The memory cells MC1 are arranged in a so called 'folded' bit line architecture, i.e., an area containing an active material 1 (or a memory cell MC1) is only existent at every second crossing of a certain word line with bit lines. If a certain word line is opened, i.e. the associated transistors are made conductive, e.g. by applying a positive voltage to this word line, then a memory cell MC1 can only be addressed via every second bit line. This arrangement is regarded as being advantageous for PCM memory cells MC1 since the area occupied by the active material 1 and the PCM memory cell MC1, resp., can be extended in size.

Figure 3:
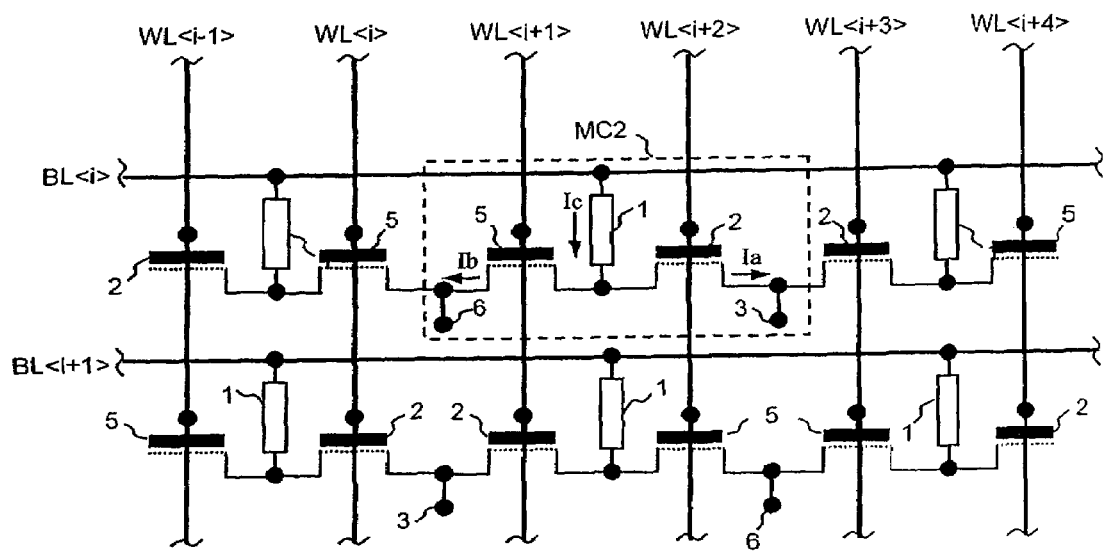
FIG. 3 illustrates a schematic circuit diagram of an exemplary structure of a resistively switching memory cell according to the invention.

FIG. 3 illustrates a cut-out from a memory device according to the invention in a diagram similar to FIG. 1.

Each memory cell MC2 now comprises at least one further switching device, i.e., a further transistor 5 for switching a further current Ib through the active material 1. The further transistor 5 is also connected to a further discharge terminal 6 that can be electrically connected to the discharge terminal 3 of the first transistor 2, e.g. by a discharge network of discharge lines or by forming an integral, common discharge terminal (not shown). If both the first transistor 2 and the further transistor 5 belonging to a certain memory cell MC2 and a certain active material 1, resp., are opened then a first current Ia flows through the first transistor 2 and a further current Ib flows through the further transistor 5 such that the current Ic flowing through the active material 1 is Ic=Ia+Ib which is larger than the current Ip flowing through the active material 1 in the arrangement according to the prior art as shown in FIG. 1. Therefore, it is possible to send a higher current Ic>Ip through the active material 1 if the other operational parameters are the same, or it is possible to reduce the width of the transistor 2 (and keep the transistor 5 at least as small) under the condition Ic=Ip. The first transistor 2 and the further transistor 5 do not need to have the same characteristics, e.g. have the same conductance or switching properties, although this is preferred.

A preferred method for operating the memory cells and the memory device, resp., is now described considering the memory cell MC2 as example:

a) if operative, both associated word lines WL<i+1> and WL<i+2> are opened (e.g., the same positive voltage is applied to them) and to set the selected memory cell MC2 (e.g. to logical '1'), a voltage Vset of a predefined duration and shape ('crystallizing pulse') is applied to the associated bit line BL<i> such that the first current Ia flows through the first transistor 2 and the further current Ib flows through the further transistor 5. By means of the combined current Ic=Ia+Ib flowing through it, the active material 1 is transformed into a crystalline phase with a low resistance/high conductivity ('writing process'). In this embodiment the characteristics of the first transistor 2 and the further transistor 5 are similar such that Ia=Ib=0.5 Ic. To achieve the required current characteristics and temperature characteristics, resp., the voltage pulse Vset is preferably controlled/shaped by the bit line BL<i> since a synchronous switching of both word lines WL<i+1> and WL<i+2> is more difficult;

to reset the selected memory cell MC2 (e.g. to logical '0'), a voltage Vreset of a different predefined duration and shape ('amorphizing pulse') is applied to the associated bit line BL<i> to bring the active material 1 into an amorphous phase with a higher resistance/lower conductivity ('deleting process'). To achieve the required current characteristics and temperature characteristics, resp., the voltage pulse Vreset is also preferably controlled/shaped by the bit line BL<i> since a synchronous switching of both word lines WL<i+1> and WL<i+2> is even more difficult, esp. regarding the required slope of the trailing edge;

to read the selected memory cell MC1, a voltage Vread of a further different predefined duration and shape ('read pulse') is applied that does not alter the phase of the active material 1 but is sufficient to determine the actual phase and thus its logical state, e. g. by measuring the current flowing. By using the two parallel transistors 2,5, the serial resistance of the selected memory cell MC1 can be reduced, leading to an improved read signal.

b) if non-operative, the associated word lines WL<i+1> and WL<i+2> are typically closed, e.g. set to 0 V or a negative voltage level.

Alternatively, only for the amorphizing pulse—that requires the highest current value—or for the crystallizing pulse or for both the amorphizing pulse and the crystallizing pulse both associated transistors 2,5 are used.

The values of at least one out of Vset, Vreset, and Vread can differ from the respective values of the prior art arrangement as shown in FIGS. 1 and 2.

After opening the respective word lines, WL<i+1> and WL<i+2> in this example, not only a selected memory cell, MC2 in this example, but also other memory cells, MC3 in this example, using the same word lines WL<i+1> and WL<i+2>, can be addressed, i.e. manipulated (set or reset) or read. By this, data can be processed in a more parallel manner than before.

To address the memory cells to the left and to the right of the memory cells MC2, MC3, the word lines WL<i−1> and WL<i>, and WL<i+3> and WL<i+4>, resp., must be opened.

Figure 4:
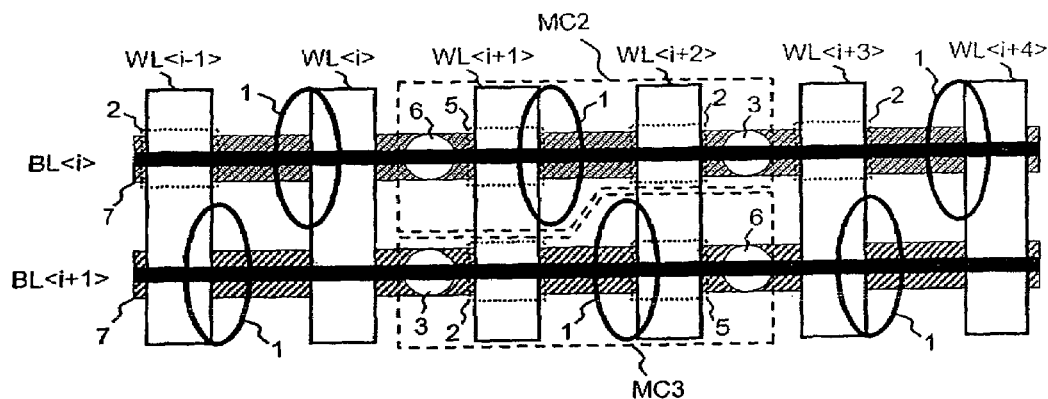
FIG. 4 illustrates a schematic view of the positions of various components of memory cells with respect to a common plane of a layout corresponding to the circuitry depicted in FIG. 3.

FIG. 4 schematically shows the positions of components corresponding to the circuit diagram of FIG. 3 on a plane parallel to the bit lines and the word lines. The arrangement is again of the $8F^2$ shape.

The memory device, of which a cut-out is shown, now contains extended diffusion areas 7 that are extended in length into regions parallel to the bit lines BL<i>, BL<i+1> that in the prior art were only used by an insulation layer. The extended diffusion areas 7 create the further transistors 5 at the crossings with the word lines WL of which for the sake of clarity only some are shown. The first transistors 2 are arranged as in the conventional folded bit line architecture layout, although with a smaller width (ideally 50%) in the direction of the word lines WL (not shown for the sake of clarity). The first transistors 2 and the further transistors 5 can be of a different type or characteristics.

The introduction of the extended diffusion areas 7 and thus the further transistors 5 can be achieved by relatively easy to implement layout changes (e. g., a different mask layout) without changing the overall form of the memory cell. There is thus no need to alter the form or position of other functional elements. Consequently, in this folded bit line architecture layout (e.g. of a $8F^2$ shaped cell), the areas containing the active material 1 are still displaced against each other such that the bit line pitch can be chosen smaller and a general compact shape can be maintained. This arrangement gives a maximum distance between active areas 1 and is thus layout friendly and is maintained as a basic shape of the layout if not as a wiring scheme.

Figure 5:
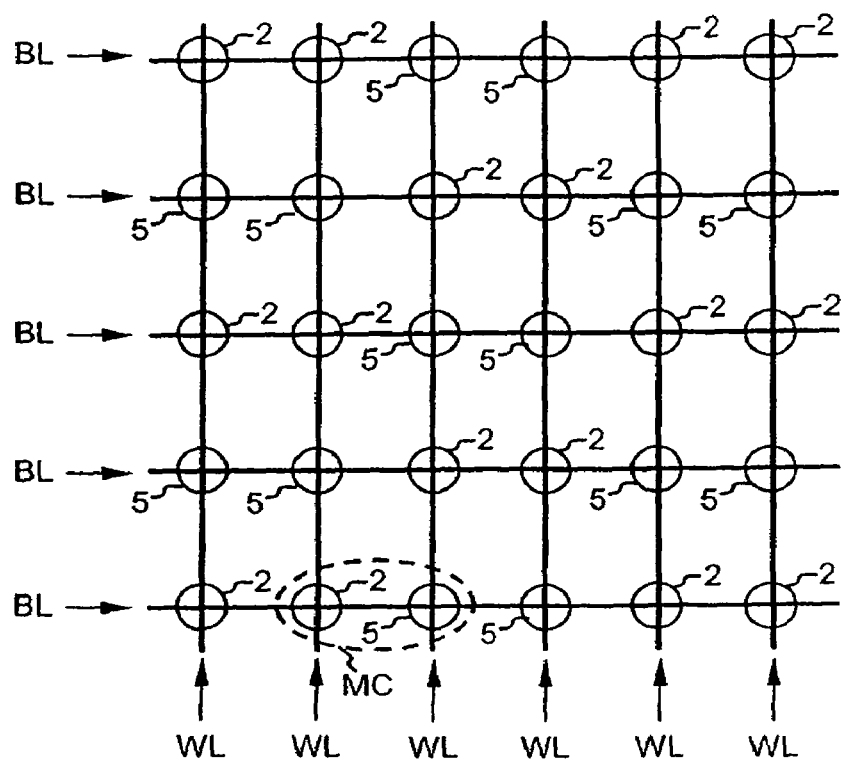
FIG. 5 schematically illustrates positions of transistors of a memory device within a certain plane.

FIG. 5 illustrates the positions of the first transistors 2 and further transistors 5 of a memory device with respect to a planar grid made up from associated bit lines BL and word lines WL.

In this embodiment, the first transistors 2 and further transistors 5 are similar such that there exists a translatory symmetry of the transistors 2,5 regarding arbitrary displacements from one position to another position.

Figure 6:
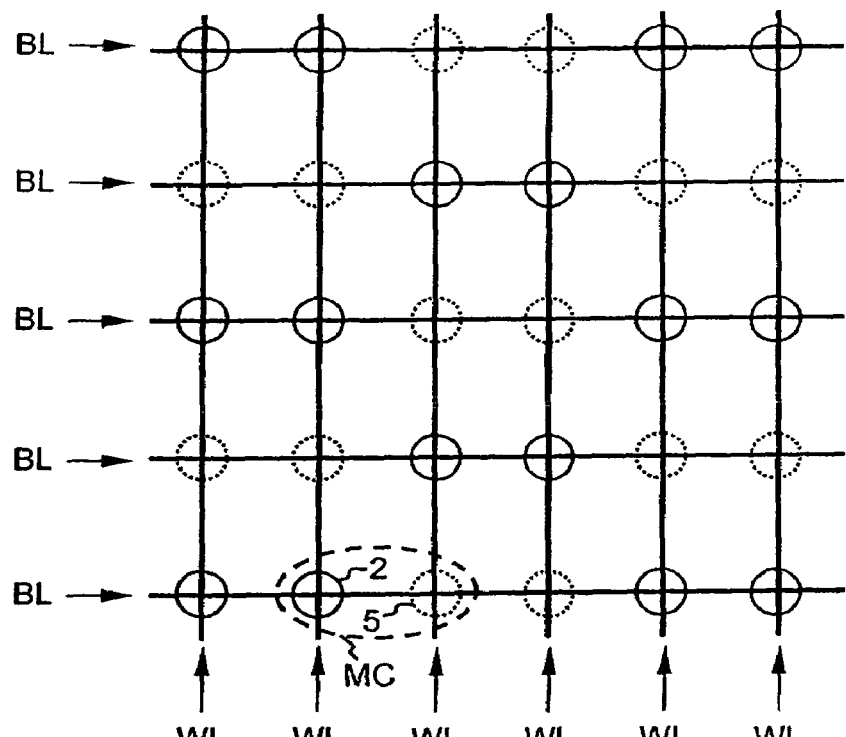
FIG. 6 schematically illustrates positions of transistors of another memory device within the plane of FIG. 5.

FIG. 6 illustrates the positions of the first transistors 2 and further transistors 5 of another memory device with respect to the planar grid made up from the associated bit lines BL and word lines WL.

In this embodiment, the first transistors 2 and further transistors 5 (indicated as dashed circles) are different (e.g., show different characteristics) such that there exists a translatory symmetry of the transistors 2,5 regarding a displacement in steps of 2 in one direction (e.g. along the bit lines BL or the word lines WL) and in a step of 1 in the other direction (e.g. along the word lines WL or the bit lines BL).

The arrangement illustrated in the FIGS. 3 to 6 only uses space that had not been used before in the folded bit line architecture, e.g. $8F^2$, cell form to provide the further transistor 5. This further transistor 5 is addressed parally to the first transistor 2 by a neighboring word line WL. It follows that the wiring concept of a folded bit line can be abandoned since the reference current to read the logical state of the memory cell MC2, MC3 does not need to be created within the folded bit line architecture cell, as opposed to, e.g., DRAMs. Thus memory cells can be addressed via all associated bit lines BL (i.e., in the range of BL<0>, . . . , BL<i>, . . . BL<n>, with n the number of the bit lines). However, the shape of the cell can still be based on the layout of the folded bit line architecture.

Advantageously, the further transistor 5 can create an additional current through the active material 1 thus achieving a smaller width of the first transistor 2.

The advantageous shape ($8F^2$) of the active material 1 and memory cell, resp., can be maintained such that its dimension in the direction of the word lines WL can be reduced, leading to a smaller cell area.

The invention is not restricted to $8F^2$ shaped cells but can be of any other form, e.g. $XF^2$, with $X \geq 6$, like $6F^2$, $20F^2$ etc.

The above preferred embodiments are not intended to restrict the invention. Those skilled in the art may make variations and modifications that are within the scope and the spirit of this invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory device with at least one memory cell comprising:
    an active material;
    a current supply line; and
    a first switching device for switching a first current from the current supply line through the active material,
    wherein the memory cell additionally comprises at least one further switching device for switching a further current from the current supply line through the active material, and
    wherein the first switching device is connected to a first current discharge terminal for switching the first current from the current supply line through the active material to the first current discharge terminal.

2. The memory device according to claim 1, wherein the memory cells are resistively switching memory cells.

3. The memory device according to claim 2, wherein the memory cells are PCM memory cells.

4. The memory device according to claim 1, wherein the current supply line is a bit line.

5. The memory device according to claim 1, wherein
    the further switching device is connected to a further current discharge terminal for switching the further current from the current supply line through the active material to the further current discharge terminal.

6. The memory device according to claim 5, wherein first current discharge terminal and the further current discharge terminal are electrically connected.

7. The memory device according to claim 1, wherein
    for controlling the first switching device a first control line is provided; and
    for controlling the further switching device a further control line is provided.

8. The memory device according to claim 1, wherein
    the first switching device is switching the first current through the active material and the first switching device; and
    the further switching device is switching the further current through the active material and the further switching device.

9. The memory device according to claim 1, wherein the first switching device is a first transistor and the further switching device is a further transistor.

10. The memory device according to claim 1, wherein the current discharge terminal is connected to a ground line.

11. A memory device with at least one memory cell comprising:
    an active material;
    a current supply line; and
    a first switching device for switching a first current from the current supply line through the active material,
    wherein the memory cell additionally comprises at least one further switching device for switching a further current from the current supply line through the active material, and
    wherein the first switching device is formed at a crossing of an extended diffusion area and one out of the first word line and the further word line; and
    wherein the further switching device is formed at a crossing of the extended diffusion area and the other one out of the first word line and the further word line.

12. The memory device according to claim 11, wherein the extended diffusion area extends parallel to an associated bit line.

13. A memory device with at least one memory cell comprising:
    an active material;
    a current supply line; and
    a first switching device for switching a first current from the current supply line through the active material,
    wherein the memory cell additionally comprises at least one further switching device for switching a further current from the current supply line through the active material, and
    wherein the first switching device and the further switching device have different characteristics.

14. A memory device with at least one memory cell comprising:
    an active material;
    a current supply line; and
    a first switching device for switching a first current from the current supply line through the active material,
    wherein the memory cell additionally comprises at least one further switching device for switching a further current from the current supply line through the active material, and
    wherein the memory device being designed and equipped such that the current supply line is adapted to be operated optionally selectively also as current discharge line; and
    wherein the memory device being designed and equipped such that the current discharge terminal is adapted to be operated optionally selectively also as current supply terminal.

15. A memory device with at least one memory cell comprising:
    an active material;
    a current supply line; and
    a first switching device for switching a first current from the current supply line through the active material,
    wherein the memory cell additionally comprises at least one further switching device for switching a further current from the current supply line through the active material,
    wherein a layout of the memory cells is based on a folded bit line architecture.

16. A memory device with at least one memory cell comprising:
- an active material;
- a current supply line; and
- a first switching device for switching a first current from the current supply line through the active material,
- wherein the memory cell additionally comprises at least one further switching device for switching a further current from the current supply line through the active material,
- wherein the memory cells are $XF^2$ shaped, with X being in integer equal to or larger than 6.

17. A method for operating at least one memory cell comprising an active material, a current supply line, a current discharge terminal, and a first switching device for switching a first current from the current supply line through the active material to the current discharge terminal, wherein the method comprises:
- supplying a first current to a respectively selected active material via the current supply line; and
- discharging the first current via the first current discharge terminal, wherein the memory cell additionally comprises at least one further switching device for switching a further current from the current supply line through the active material, wherein the method comprises the further steps of:
- supplying a further current to the selected active material via the associated current supply line; and
- discharging the further current.

18. The method according to claim 17, wherein
- for controlling the first switching device a first word line is provided; and
- for controlling the further switching device a further word line is provided.

19. The method according to claim 18, wherein for performing at least one out of a setting step for setting the memory cell, a resetting process for resetting the memory cell, and a reading step for reading the memory cell, wherein the first switching device is opened by the first word line and the further switching device is opened by the further word line.

20. The method according to claim 17, wherein a shape of the first current and the further current is determined by the current supply line.

21. The method according to claim 17, wherein at least one other memory cell associated with the first word line and the further word line is manipulated via a respectively associated bit line.

22. The method according to claim 17, wherein the memory cells are resistively switching memory cells.

23. The method according to claim 22, wherein the memory cells are phase change memory cells.

24. The method according to claim 17, the method additionally comprising:
- operating the current supply line additionally also as a current discharge line.

25. The method according to claims 24 comprising wherein, during a first access of the memory cell, the current supply line is operated as current supply line and the current discharge terminal as current discharge terminal and, during a second, in particular subsequent access of the memory cell, the current supply line is operated as current discharge line and the current discharge terminal as current supply terminal.

26. The method according to claim 17, the method additionally comprising:
- operating the current discharge terminal additionally also as current supply terminal.

27. A memory device with at least one memory cell comprising:
- an active material;
- a current supply line; and
- a first switching device for switching a first current from the current supply line though the active material,
- wherein the memory cell additional comprises at least one further switching device for switching a further current from the current supply line through the active material,
- further wherein for controlling the first switching device a first word line is provided, and for controlling the further switching device a further word line is provided, and
- wherein the first switching device is formed at a crossing of an extended diffusion area and one out of the first word line and the further word line.

28. A memory device comprising:
- a phase change material;
- a current supply line;
- a first transistor, a source-drain path of the first transistor connected to the phase change material for switching a first current from the current supply line through the phase change material; and
- at least one further transistor, a source-drain path of the further transistor connected to the source-drain path of the first transistor and to the phase change material for switching a further current from the current supply line through the phase change material in addition to the first current.

* * * * *